United States Patent [19]
Ovens

[11] Patent Number: 5,819,099
[45] Date of Patent: *Oct. 6, 1998

[54] VOLTAGE CONVERTING I/O DRIVER CIRCUIT

[75] Inventor: Kevin M. Ovens, Plano, Tex.

[73] Assignee: Texas Instruments Incorporated, Dallas, Tex.

[*] Notice: This patent issued on a continued prosecution application filed under 37 CFR 1.53(d), and is subject to the twenty year patent term provisions of 35 U.S.C. 154(a)(2).

[21] Appl. No.: 731,340

[22] Filed: Oct. 18, 1996

[51] Int. Cl.$^6$ .................................................. G06F 1/26
[52] U.S. Cl. .................... 395/750.01; 326/57; 326/68; 326/83; 327/333
[58] Field of Search .................. 395/750.01; 326/68, 326/57, 83; 327/333; 365/189.11

[56] References Cited

U.S. PATENT DOCUMENTS

| | | | |
|---|---|---|---|
| 4,926,070 | 5/1990 | Tanaka et al. | 326/81 |
| 5,341,045 | 8/1994 | Almulla | 326/68 |
| 5,399,920 | 3/1995 | Van Tran | 326/83 |
| 5,408,147 | 4/1995 | Yarbrough et al. | 326/68 |
| 5,422,523 | 6/1995 | Roberts et al. | 326/68 |
| 5,490,119 | 2/1996 | Sakurai et al. | 365/230.08 |
| 5,559,464 | 9/1996 | Orii et al. | 327/333 |
| 5,687,122 | 11/1997 | Merritt | 365/189.05 |

*Primary Examiner*—Gopal C. Ray
*Attorney, Agent, or Firm*—J. Dennis Moore; James C. Kesterson; Richard L. Donaldson

[57] ABSTRACT

A digital data signal voltage converter for converting a first digital data signal that is asserted at a first pair of voltage levels that are considered the inverse of one another, the two voltage levels being a first low voltage level and a first high voltage level, to a second digital data signal that is asserted at a second pair of voltage levels that are considered the inverse of one another, the second pair of voltage levels being a second low voltage level and a second high voltage level, the second high voltage level being higher than the first high voltage level. The voltage converter includes an active pull-up transistor and an active pull-down transistor, along with circuitry for controlling the second high voltage level. Three-state control may be provided to allow use as an input/output terminal.

14 Claims, 3 Drawing Sheets

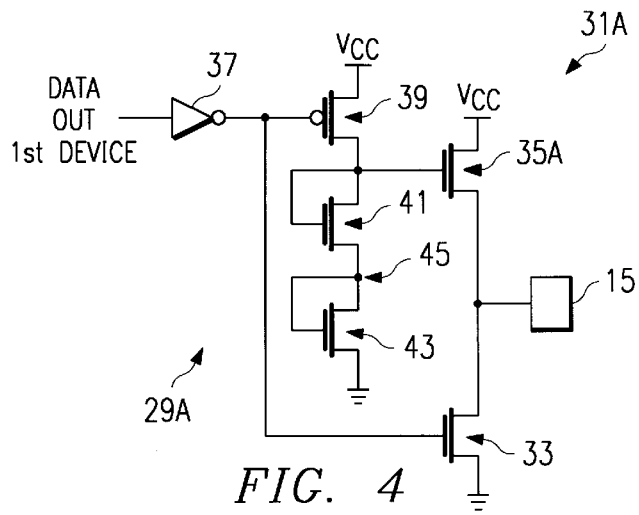
FIG. 4
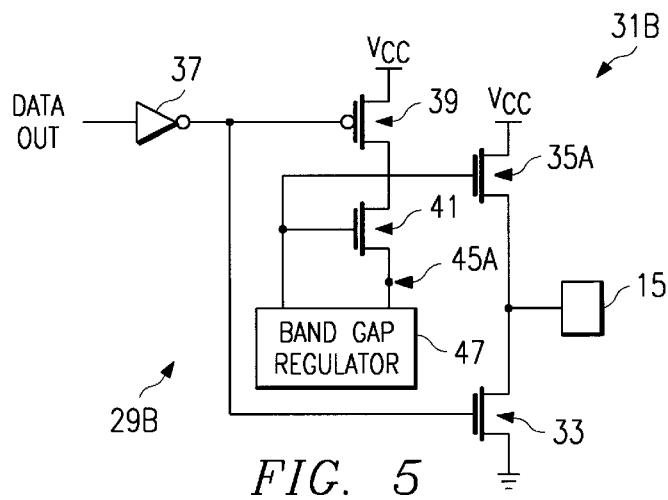
FIG. 5
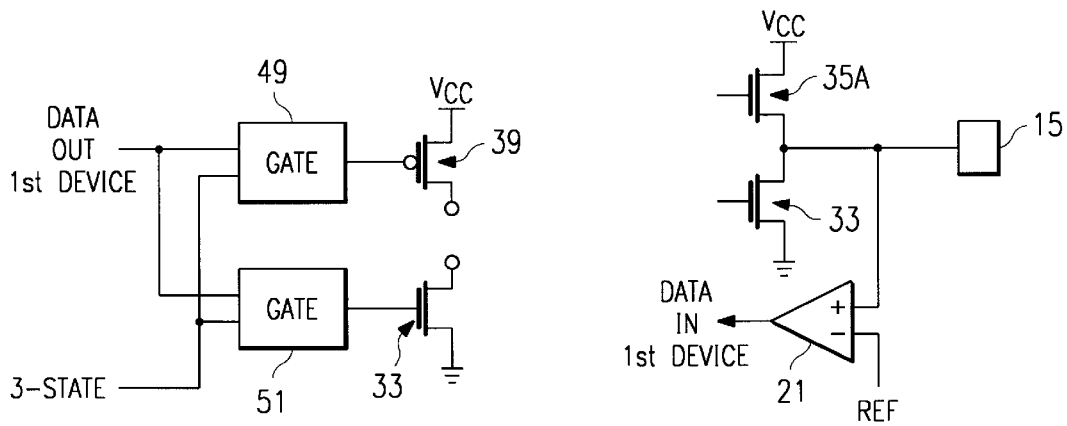
FIG. 6A
FIG. 6B

VOLTAGE CONVERTING I/O DRIVER CIRCUIT

FIELD OF THE INVENTION

The invention relates generally to digital input/output (I/O) bus structures and, more particularly, to digital I/O bus structures for interfacing between electronic devices that are powered by different power supply voltages.

BACKGROUND OF THE INVENTION

FIG. 1 illustrates a conventional ground-referenced digital I/O bus structure which is typically referred to as CTL or GTL. In FIG. 1, data to be output from a first device (such as an IC) drives control logic 11 which in turn drives the gate of an n-channel transistor 13. The source of transistor 13 is grounded and the drain of transistor 13 is connected to an output terminal 15 of the first device. The terminal (or pin) 15 is connected by a 50 ohm transmission line 17 to an input terminal 19 of a second device (such as an IC). The terminal (or pin) 19 is connected to the non-inverting input of a line receiver 21. The inverting input of the line receiver 21 is connected to a voltage reference of, in this example, 0.8 volts. The output of line receiver 21 provides a data input to the second device. Each of the terminals 15 and 19 is pulled up to 1.2 volts by a 50 ohm pull-up resistor. An output voltage within the range of 0 to 0.4 volts on terminal 15 represents a logic 0 in FIG. 1, and the 1.2 volt pull-up voltage represents a logic 1, and thus the 0.8 volt reference on the inverting input of line receiver 21 is midway between the logic 0 and logic 1 levels.

The present invention recognizes a heretofore unrecognized application for ground-referenced I/O bus structures such as shown in FIG. 1. This heretofore unrecognized application is illustrated in exemplary FIG. 2 wherein a device 23 which operates from a 3 volt power supply communicates via a ground-referenced digital I/O bus structure 25 with a device 27 which operates from a 5 volt power supply. Because the bus structure at 25 is referenced to ground and not to the power supply voltage of either device 23 or 27, it operates independently of the power supplies of the respective devices 23 and 27, thus providing satisfactory data transfer regardless of the power supply voltages of the devices 23 and 27.

In contrast to FIG. 2, conventional I/O bus structures which are $V_{cc}$- referenced present problems when interfacing between devices which do not operate from the same $V_{cc}$.

The device 23 in FIG. 2 could be, for example, a microprocessor, and the device 27 could be a peripheral device such as a keyboard, hard disk drive etc. As technology continues to advance, the power supply voltages of some state of the art devices and ICs, for example microprocessors, will become lower and lower. However, it will be desirable for such state of the art devices to interface and communicate with much older devices and ICs which will likely operate from a power supply which is higher than that of the state of the art device. This is the situation illustrated in FIG. 2. The arrangement of FIG. 2 is generally applicable to communication between any two devices which operate from different power supply voltages.

Referencing again the conventional ground-referenced I/O bus structure of FIG. 1, this structure has the following exemplary disadvantages. The 50 ohm resistor associated with terminal 15 causes the transistor 13 to have an undesirably slow switching speed. The resistor also results in undesirably high power dissipation, an undesirably low ratio of bus pins to ground pins, and also requires the transistor 13 to be undesirably large because the transistor 13 must be capable of sinking a typical current of 40 mA.

In view of the foregoing disadvantages of the prior art ground-referenced I/O bus structure of FIG. 1, and further in view of the aforementioned and heretofore unrecognized application for ground-referenced I/O bus structures (see FIG. 2), it is desirable to provide a ground-referenced I/O bus structure which overcomes these disadvantages of the prior art.

The present invention provides a ground-referenced I/O bus structure with an active pull-up feature which overcomes the aforementioned disadvantages of the prior art structure.

BRIEF DESCRIPTION OF THE DRAWINGS

FIG. 4 illustrates the output structure of FIG. 3 in greater detail.

FIG. 5 illustrates an alternative to the structure illustrated in FIG. 4.

FIG. 6A illustrates how FIGS. 4 and 5 can be modified to provide a 3-state output.

FIG. 6B, taken in conjunction with FIG. 6A, illustrates how the structures of FIGS. 4 and 5 can be modified to provide an I/O terminal.

DETAILED DESCRIPTION OF THE INVENTION

Figure 3:
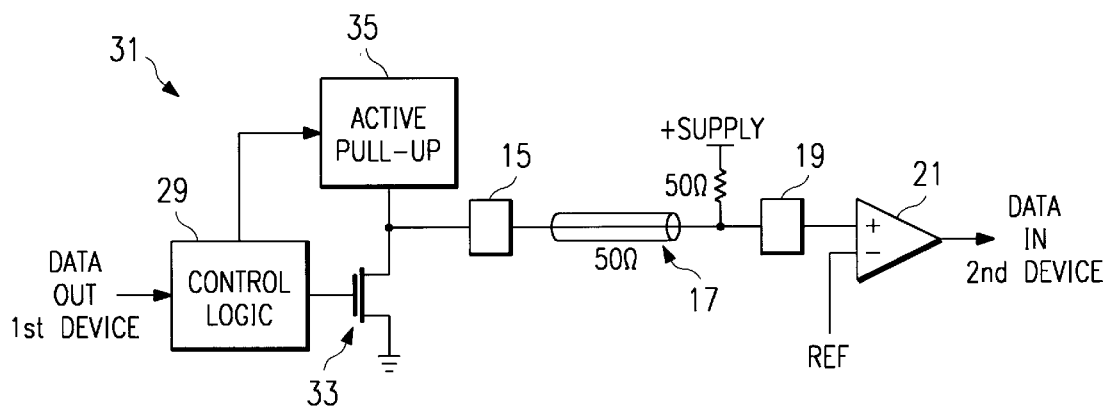
FIG. 3 illustrates an exemplary I/0 bus structure according to the present invention.

FIG. 3 illustrates an exemplary ground-referenced digital I/O bus structure according to the present invention. In FIG. 3, an output structure 31 includes control logic 29 that receives the data to be output from the first device, and in turn drives the gate of an n-channel transistor 33, and also drives an active pull-up circuit 35. The output terminal 15 of the first device is connected to the active pull-up circuit 35 and the transistor 33 at the drain of transistor 33. A 50 ohm transmission line 17 connects the output terminal 15 of the first device to the input terminal 19 of the second device. The input terminal 19 is also connected to the non-inverting input of line receiver 21 whose inverting input is connected to a reference voltage REF. The output of line receiver 21 provides the data to be input to the second device. The terminal 19 is pulled up through a 50 ohm resistor to, for example, the positive supply voltage ($V_{cc}$) of the second device.

FIG. 4 illustrates at 31A an exemplary embodiment of the output structure 31 of FIG. 3. As shown in FIG. 4, in this embodiment, the control logic 29A includes an inverter 37, a p-channel transistor 39 and two n-channel transistors 41 and 43. The active pull up circuit is implemented in FIG. 4 as an n-channel transistor 35A. The drain of transistor 35A is connected to $V_{cc}$ and the source of transistor 35A is connected to the output terminal 15. The drain of transistor 33 is connected to output terminal 15, and the source thereof is connected to ground. The source of p-channel transistor 39 is connected to $V_{cc}$ and the drain of transistor 39 is connected to the drain and gate of transistor 41 and also to the gate of transistor 35A. The source of transistor 41 is connected to the drain and gate of transistor 43, and the source of transistor 43 is connected to ground. The data to be output from the first device is connected to the input of inverter 37, and the output inverter 37 is connected to the gate of transistor 39 and the gate of transistor 33.

In the arrangement of FIG. 4, if the current density in transistor 35A is matched to the current density in transistor 41, then the voltage at terminal 15 will match the voltage at node 45. The control circuitry 29A thus provides a clamping function which advantageously controls the voltage swing at output terminal 15.

FIG. 5 illustrates at 31B another exemplary embodiment of the output structure 31 of FIG. 3. In this example, the active pull up is implemented as an n-channel transistor 35A as in FIG. 4. The control logic 29B of FIG. 5 includes a band gap regulator 47 connected to the source and gate of transistor 41. The drain of transistor 41 is connected to the drain of transistor 39 as in FIG. 4, but the gate of transistor 35A is connected only to the gate of transistor 41, and is not connected to the common drain-drain connection between transistors 39 and 41. The control logic 29B provides a clamping function and output voltage swing control at output terminal 15. In FIG. 5, if the current density in transistor 35A is matched to the current density in transistor 41, then the voltage at terminal 15 will match the voltage at node 45A.

FIG. 6A illustrates how FIGS. 4 and 5 can be modified to provide a 3-state output at terminal 15. As illustrated in FIG. 6A, the data to be output from the first device is input along with a 3-state control signal to gating circuits 49 and 51. The output of gating circuit 49 drives the gate of transistor 39, and the output of gating circuit 51 drives the gate of transistor 33. Thus, the data to be output from the first device is gated with the 3-state control signal so that the 3-state control signal can selectively switch the output terminal 15 between an output mode wherein it is driven by the data output, and a 3-state mode wherein the terminal 15 is 3-stated.

If the output structures 31A and 31B of FIGS. 4 and 5 are provided with the 3-state control arrangement of FIG. 6A, then a line receiver 21 can be connected as shown in FIG. 6B to permit terminal 15 to operate as an input/output terminal. When data is to be input to the first device, the 3-state control signal of FIG. 6A is activated.

Figure 7:
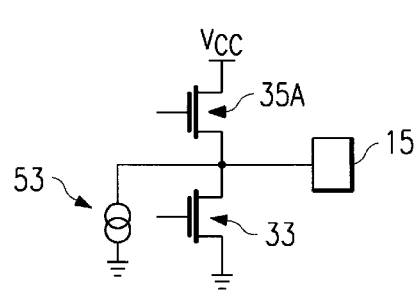
FIG. 7 illustrates how FIGS. 4 and 5 can be modified to provide improved output voltage control.

FIG. 7 illustrates an additional modification which can be utilized in the control logic 29A of FIG. 4 and the control logic 29B in FIG. 5. In FIG. 7, a current sink 53 is connected between output terminal 15 and ground in order to provide improved output voltage control.

Figure 8:
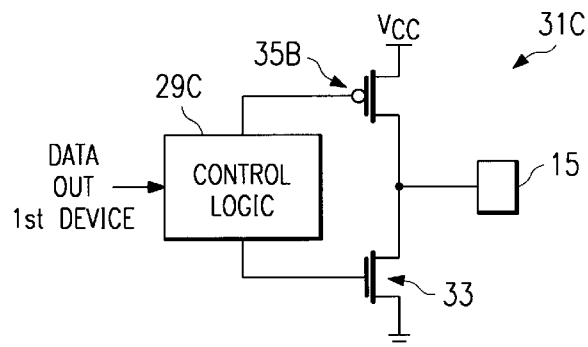
FIG. 8 illustrates an alternative embodiment of the output structure of FIG. 3.

FIG. 8 illustrates at 31C another exemplary embodiment of the FIG. 3 output structure 31. In the output structure 31C of FIG. 8, the active pull up is implemented as a p-channel transistor 35B. Control logic 29C receives the data to be output from the first device, and in turn drives the transistors 35B and 33.

Figure 9:
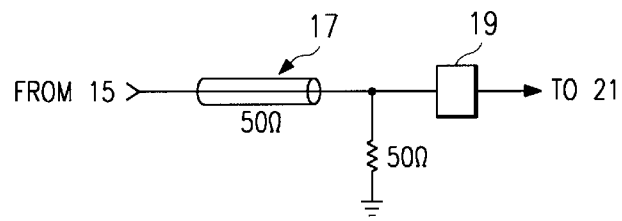
FIG. 9 shows an alternative transmission line termination which can be used in the arrangement of FIG. 3.

FIG. 9 illustrates an alternative transmission line termination which can be used in the I/O bus structure of FIG. 3.

In FIG. 9, the 50 ohm resistor of FIG. 3 is connected between terminal 19 and ground to thus function as a pull-down resistor.

Figure 10:
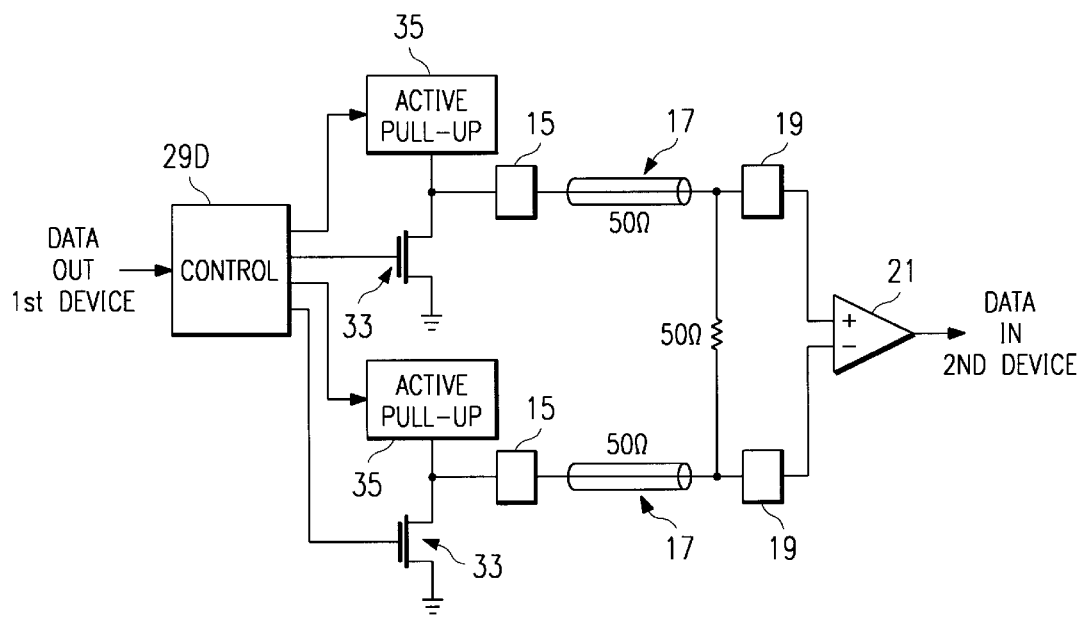
FIG. 10 is similar to FIG. 3 but illustrates an exemplary differential I/O bus structure according to the present invention.

FIG. 10 is similar to FIG. 3 but illustrates an example of the present invention applied to a differential data transmission application. The control logic 29D in FIG. 10 can be implemented using any two identical embodiments of the control logic described hereinabove, but of course inverting the data that is applied to one of the identical control logic embodiments.

Figure 1:
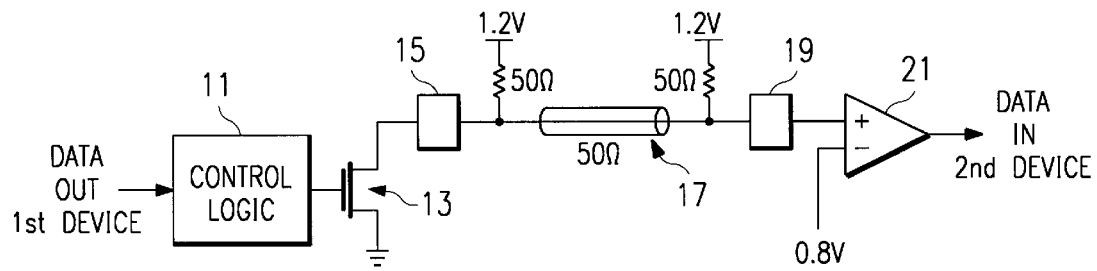
FIG. 1 illustrates a conventional ground-referenced I/O bus structure.
Figure 2:
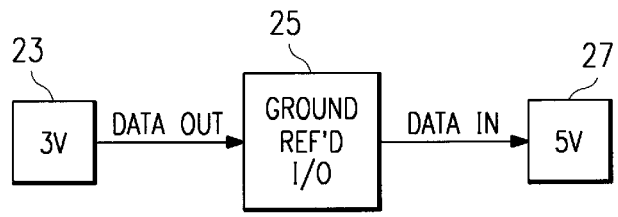
FIG. 2 illustrates an arrangement according to the present invention for interfacing between devices which are powered by different power supply voltages.

The ground-referenced digital I/O bus structures illustrated in FIGS. 3–10 advantageously provide a much lower impedance pull-up at terminal 15 than does the 50 ohm resistor in FIG. 1. The pull-down transistor 33 requires much less switching current sink capability because, as it begins the switching operation, it initially drives only the transmission line 17. Thus, the switching speed of transistor 33 is faster than that of transistor 13. In the steady state, the pull-down resistor 33 sinks only a 50 ohm load rather than the 25 ohm load (two 50 ohm resistors in parallel) which the transistor 13 of prior art FIG. 1 must sink. Thus, the pull-down transistor 33 of FIGS. 3–10 can be designed with a substantially smaller geometry than the pull-down transistor 13 of prior art FIG. 1. Because the transistor 33 sinks less current than the transistor 13 of prior art FIG. 1, the arrangements of FIGS. 3–10 advantageously have less power dissipation than the prior art arrangement of FIG. 1, including an advantageously higher bus pins to ground pins ratio.

Although exemplary embodiments of the present invention are described above, this description does not limit the scope of the invention, which can be practiced in a variety of embodiments.

What is claimed is:

1. A digital data signal voltage converter for converting a first digital data signal that is asserted at a first pair of voltage levels that are considered the inverse of one another, said two voltage levels being a first low voltage level and a first high voltage level, to a second digital data signal that is asserted at a second pair of voltage levels that are considered the inverse of one another, said second pair of voltage levels being a second low voltage level and a second high voltage level, said second high voltage level being higher than said first high voltage level, and comprising:

an inverter for receiving said first digital data signal and providing an output that is the inverse of said input;

a clamping arrangement coupled between said second high voltage level and a ground reference, responsive to the output of said inverter, for providing a voltage at a first reference node that is the inverse of the level of said output of said inverter and controlled to a predetermined level;

an active pull-up transistor having its gate coupled to said clamping arrangement, having its drain coupled to said second high voltage level, and having its source coupled to an output node; and an active pull-down transistor having its gate coupled to the output of said inverter, having its source coupled to said ground reference and having its drain coupled to said output node;

said clamping arrangement controlling said active pull-up transistor to provide a voltage at said output node that is controlled to substantially said voltage level at said first reference node.

2. A digital data signal voltage converter as in claim 1 further comprising a current sink connected between said output node and said ground reference.

3. A digital data signal voltage converter according to claim 1 wherein said active pull-up transistor comprises an n-channel transistor.

4. A digital data signal voltage converter according to claim 1 wherein said active pull-up transistor comprises a p-channel transistor.

5. A digital data signal voltage converter for converting a first digital data signal that is asserted at a first pair of voltage levels that are considered the inverse of one another, said two voltage levels being a first low voltage level and a first high voltage level, to a second digital data signal that is asserted at a second pair of voltage levels that are considered the inverse of one another, said second pair of voltage levels being a second low voltage level and a second high voltage level, said second high voltage level being higher than said first high voltage level, and comprising:

an inverter for receiving said first digital data signal and providing an output that is the inverse of said input;

control logic responsive to the output of said inverter for providing a control signal;

an active pull-up transistor having its gate coupled to said control logic, having its drain coupled to said second high voltage level, and having its source coupled to an output node;

an active pull-down transistor having its gate coupled to the output of said inverter, having its source coupled to said ground reference and having its drain coupled to said output node; and a band gap regulator, coupled to said control logic for controlling the level of said control signal so as to cause said active pull-up transistor to provide a signal at said output node that is substantially controlled to a predetermined reference voltage level.

6. A digital data signal voltage converter as in claim 5 further comprising a current sink connected between said output node and said ground reference.

7. A digital data signal voltage converter according to claim 5 wherein said active pull-up transistor comprises an n-channel transistor.

8. A digital data signal voltage converter according to claim 5 wherein said active pull-up transistor comprises a p-channel transistor.

9. A digital data signal voltage converter for converting a first digital data signal that is asserted at a first pair of voltage levels that are considered the inverse of one another, said two voltage levels being a first low voltage level and a first high voltage level, and a first 3-state control signal, to a second digital data signal that is asserted at a second pair of voltage levels that are considered the inverse of one another, said second pair of voltage levels being a second low voltage level and a second high voltage level, said second high voltage level being higher than said first high voltage level, and to a 3-state level, respectively, comprising:

control logic for providing a control signal, said control logic including a first gating circuit receiving said first digital data signal and said 3-state control signal and a second gating circuit receiving said first digital data signal and said 3-state control signal;

an active pull-up transistor having its gate coupled to said control logic, having its drain coupled to said second high voltage level, and having its source coupled to an output node;

an active pull-down transistor having its gate coupled to the output of said inverter, having its source coupled to said ground reference and having its drain coupled to said output node; and a band gap regulator, coupled to said control logic for controlling the level of said control signal so as to cause said active pull-up transistor to provide a signal at said output node that is substantially controlled to a predetermined reference voltage level, and for providing a 3-state level at said output node in response to said 3-state control signal.

10. A digital data signal voltage converter as in claim 9 further comprising a line receiver having an input coupled to said output node, and having an output providing data input, whereby said digital data signal voltage converter operates as in input/output terminal.

11. A digital data signal voltage converter for converting a first digital data signal that is asserted at a first pair of voltage levels that are considered the inverse of one another, said two voltage levels being a first low voltage level and a first high voltage level, and a first 3-state control signal, to a second digital data signal that is asserted at a second pair of voltage levels that are considered the inverse of one another, said second pair of voltage levels being a second low voltage level and a second high voltage level, said second high voltage level being higher than said first high voltage level, and to a 3-state level, respectively, comprising:

control logic for providing a control signal, said control logic including a first gating circuit receiving said first digital data signal and said 3-state control signal and a second gating circuit receiving said first digital data signal and said 3-state control signal;

a clamping arrangement coupled between said second high voltage level and a ground reference, responsive to the output of said first gating circuit, for providing a voltage at a first reference node that follows the level of said first digital data signal and is controlled to a predetermined level;

an active pull-up transistor having its gate coupled to said clamping arrangement, having its drain coupled to said second high voltage level, and having its source coupled to an output node; and an active pull-down transistor having its gate coupled to the output of said second gating circuit, having its source coupled to said ground reference and having its drain coupled to said output node;

said clamping arrangement, said first gating circuit and said second gating circuit controlling said active pull-up transistor and said active pull-down transistor to provide a voltage at said output node that is controlled in a high mode to substantially said voltage level at said first reference node, and to a 3-state in response to said 3-state control signal.

12. A digital data signal voltage converter as in claim 11 further comprising a line receiver having an input coupled to said output node, and having an output providing data input, whereby said digital data signal voltage converter operates as in input/output terminal.

13. A digital data signal voltage converter for converting a first digital data signal that is asserted at a first pair of voltage levels that are considered the inverse of one another, said two voltage levels being a first low voltage level and a first high voltage level, to a second digital data signal that is asserted differentially, at a first output node and a second output node, at a second pair of voltage levels that are considered the inverse of one another, said second pair of voltage levels being a second low voltage level and a second high voltage level, said second high voltage level being higher than said first high voltage level, and comprising:

an inverter for receiving said first digital data signal and providing an output that is the inverse of said input;

a first clamping arrangement coupled between said second high voltage level and a ground reference, responsive to the output of said inverter, for providing a voltage at a first reference node that is the inverse of the level of said output of said inverter and controlled to a predetermined level;

a first active pull-up transistor having its gate coupled to said first clamping arrangement, having its drain coupled to said second high voltage level, and having its source coupled to said first output node;

a first active pull-down transistor having its gate coupled to the output of said inverter, having its source coupled to said ground reference and having its drain coupled to said first output node;

said first clamping arrangement controlling said active pull-up transistor to provide a voltage at said first output node that is controlled to substantially said voltage level at said first reference node;

a second clamping arrangement coupled between said second high voltage level and said ground reference, responsive to said first digital data signal, for providing a voltage at a second reference node that is the inverse of the level of said output of said inverter and controlled to a predetermined level;

a second active pull-up transistor having its gate coupled to said clamping arrangement, having its drain coupled to said second high voltage level, and having its source coupled to said second output node; and a second active pull-down transistor having its gate coupled to receive said first digital data signal, having its source coupled to said ground reference and having its drain coupled to said second output node;

said second clamping arrangement controlling said active pull-up transistor to provide a voltage at said second output node that is controlled to substantially said voltage level at said second reference node.

14. A digital data signal voltage converter for converting a first digital data signal that is asserted at a first pair of voltage levels that are considered the inverse of one another, said two voltage levels being a first low voltage level and a first high voltage level, to a second digital data signal that is asserted differentially, at a first output node and a second output node, at a second pair of voltage levels that are considered the inverse of one another, said second pair of voltage levels being a second low voltage level and a second high voltage level, said second high voltage level being higher than said first high voltage level, and comprising:

an inverter for receiving said first digital data signal and providing an output that is the inverse of said input;

first control logic responsive to the output of said inverter for providing a first control signal;

a first active pull-up transistor having its gate coupled to said first control logic, having its drain coupled to said second high voltage level, and having its source coupled to said first output node;

a first active pull-down transistor having its gate coupled to the output of said inverter, having its source coupled to said ground reference and having its drain coupled to said first output node;

a first band gap regulator, coupled to said first control logic for controlling the level of said first control signal so as to cause said active pull-up transistor to provide a signal at said first output node that is substantially controlled to a predetermined reference voltage level;

second control logic responsive to said first digital data signal for providing a second control signal;

a second active pull-up transistor having its gate coupled to said second control logic, having its drain coupled to said second high voltage level, and having its source coupled to said second output node;

a second active pull-down transistor having its gate coupled to receive said first digital data signal, having its source coupled to said ground reference and having its drain coupled to said second output node; and a second band gap regulator, coupled to said second control logic for controlling the level of said second control signal so as to cause said active pull-up transistor to provide a signal at said second output node that is substantially controlled to a predetermined reference voltage level.

* * * * *